(12) United States Patent
Bernard et al.

(10) Patent No.: US 10,746,769 B2
(45) Date of Patent: Aug. 18, 2020

(54) UNDULATING-CONDUCTOR WIRELESS SENSOR AND SENSING SYSTEM

(71) Applicant: Textile Instruments, LLC, Perrysburg, OH (US)

(72) Inventors: Susan P. Bernard, Perrysburg, OH (US); Robert P. Donley, Denver, CO (US)

(73) Assignee: TEXTILE INSTRUMENTS, LLC, Perrysburg, OH (US)

( * ) Notice: Subject to any disclaimer, the term of this patent is extended or adjusted under 35 U.S.C. 154(b) by 265 days.

(21) Appl. No.: 15/838,432

(22) Filed: Dec. 12, 2017

(65) Prior Publication Data

US 2018/0164357 A1    Jun. 14, 2018

Related U.S. Application Data

(60) Provisional application No. 62/433,818, filed on Dec. 14, 2016.

(51) Int. Cl.
*G01R 27/26* (2006.01)
*G01N 27/00* (2006.01)
*G01N 27/02* (2006.01)
*G01N 27/22* (2006.01)

(52) U.S. Cl.
CPC ............ *G01R 27/26* (2013.01); *G01N 27/00* (2013.01); *G01N 27/023* (2013.01); *G01N 27/226* (2013.01); *G01N 27/223* (2013.01)

(58) Field of Classification Search
CPC .... G01R 27/26; G01N 27/226; G01N 27/023; G01N 27/00; G01N 27/223
USPC ........................................... 324/655; 235/441
See application file for complete search history.

(56) References Cited

U.S. PATENT DOCUMENTS

| | | | |
|---|---|---|---|
| 8,430,327 B2 * | 4/2013 | Woodard | H04Q 9/00 235/449 |
| 2015/0084636 A1 * | 3/2015 | Popescu | H04B 1/0483 324/322 |

* cited by examiner

*Primary Examiner* — Farhana A Hoque
(74) *Attorney, Agent, or Firm* — Peter J. Van Bergen

(57) ABSTRACT

A wireless sensor includes at least one undulating electrical conductor. The undulating electrical conductor(s) extends along a spiral path between its first end and second end that remain electrically unconnected. Each undulating electrical conductor has inductance and capacitance wherein, in the presence of a time-varying magnetic field, the undulating electrical conductor(s) resonates to generate a harmonic response.

9 Claims, 8 Drawing Sheets

UNDULATING-CONDUCTOR WIRELESS SENSOR AND SENSING SYSTEM

Pursuant to 35 U.S.C. § 119, the benefit of priority from provisional application 62/433,818 with a filing date of Dec. 14, 2016, is claimed for this non-provisional application.

FIELD OF THE INVENTION

The invention relates generally to wireless sensors, and more particularly to a wireless sensor constructed using one or more undulating conductors.

BACKGROUND OF THE INVENTION

Sensors are used in a wide variety of applications. Traditionally, a sensor converts a sensed attribute to an electrical signal that is then transmitted along a conductor that couples the sensor to a receiver. More recently, a wireless sensing system disclosed in U.S. Pat. No. 8,430,327 utilizes an open-circuit spiral-shaped conductor as a sensor that is activated and interrogated by means of a wirelessly-transmitted time-varying magnetic field. Changes in the sensor's harmonic response are indicative of an attribute being sensed. This system eliminates the need to use conductors/wires to transmit a sensed signal to a receiver. The sensor lies in a plane that can be attached to or embedded in a substrate or structure. Such attachments and embedding schemes can introduce manufacturing and performance issues. In addition, performance of planar spiral-trace sensors can only be modified or tuned for optimization by altering, for example, the number of turns in the spiral, the width of the conductor, and/or the spacing between adjacent turns of the spiral. All such modifications occur within the plane of the sensor. However, many performance-related attributes of a sensor occur in three dimensions.

SUMMARY OF THE INVENTION

Accordingly, it is an object of the present invention to provide a wireless sensor that is simple to manufacture and provides performance tuning in three dimensions.

Other objects and advantages of the present invention will become more obvious hereinafter in the specification and drawings.

In accordance with the present invention, a wireless sensor includes at least one undulating electrical conductor having a first end and a second end. The undulating electrical conductor(s) extends along a spiral path between its first end and second end. The first end and second end remain electrically unconnected. Each undulating electrical conductor has inductance and capacitance wherein, in the presence of a time-varying magnetic field, the undulating electrical conductor(s) resonates to generate a harmonic response.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
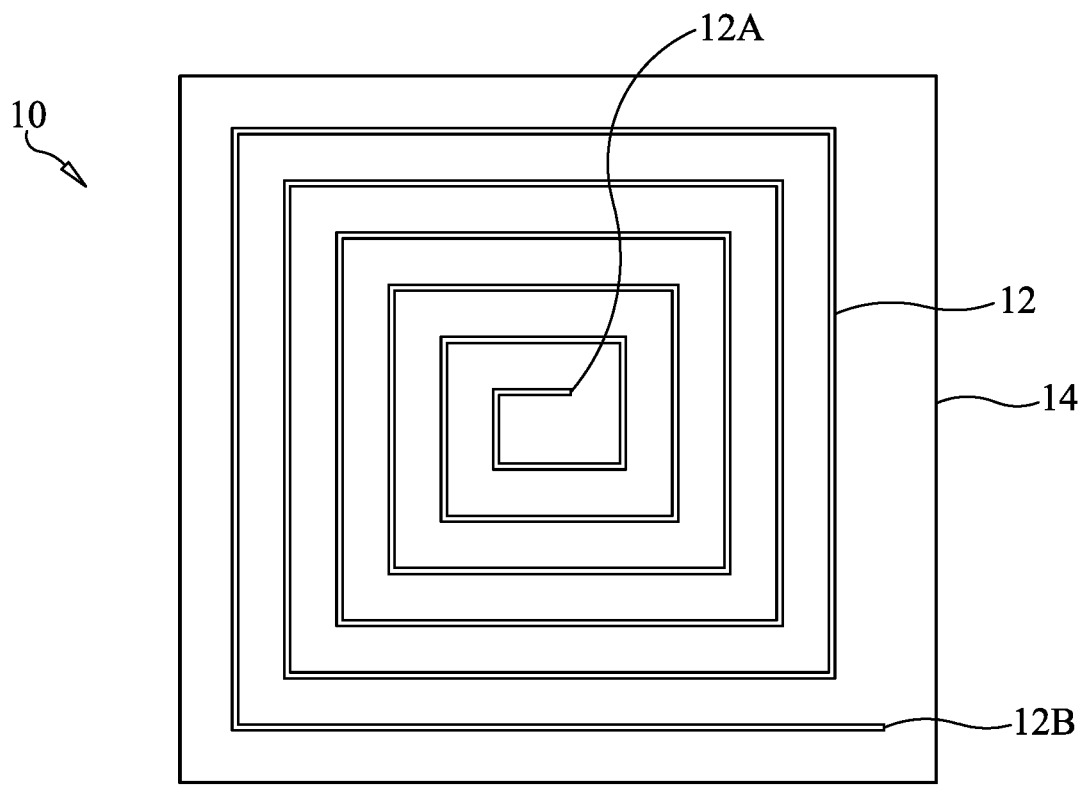
FIG. 1 is a plan view of a planar spiral-trace sensor in accordance with the prior art.

Referring now to the drawings and more particularly to FIG. 1, a wireless sensor in accordance with the teachings of U.S. Pat. No. 8,430,327 is shown and is referenced generally by numeral 10. Briefly, sensor 10 is a spiral winding of an electrically-conductive wire or trace 12 deposited on a planar substrate 14 such that spiral trace sensor 10 lies in a plane. Ends 12 and 12B of conductor 12 remain open or unconnected. Accordingly, spiral trace sensor 10 is said to be an open-circuit device. In general, the capacitance, inductance, and resistance of the spiraled conductor 12 determine the sensor's response to a time-varying magnetic field. The number of spirals, width of conductor 12, and/or spacing between adjacent portions of the spiral can be adjusted to adjust the performance of sensor 10.

Figure 2:
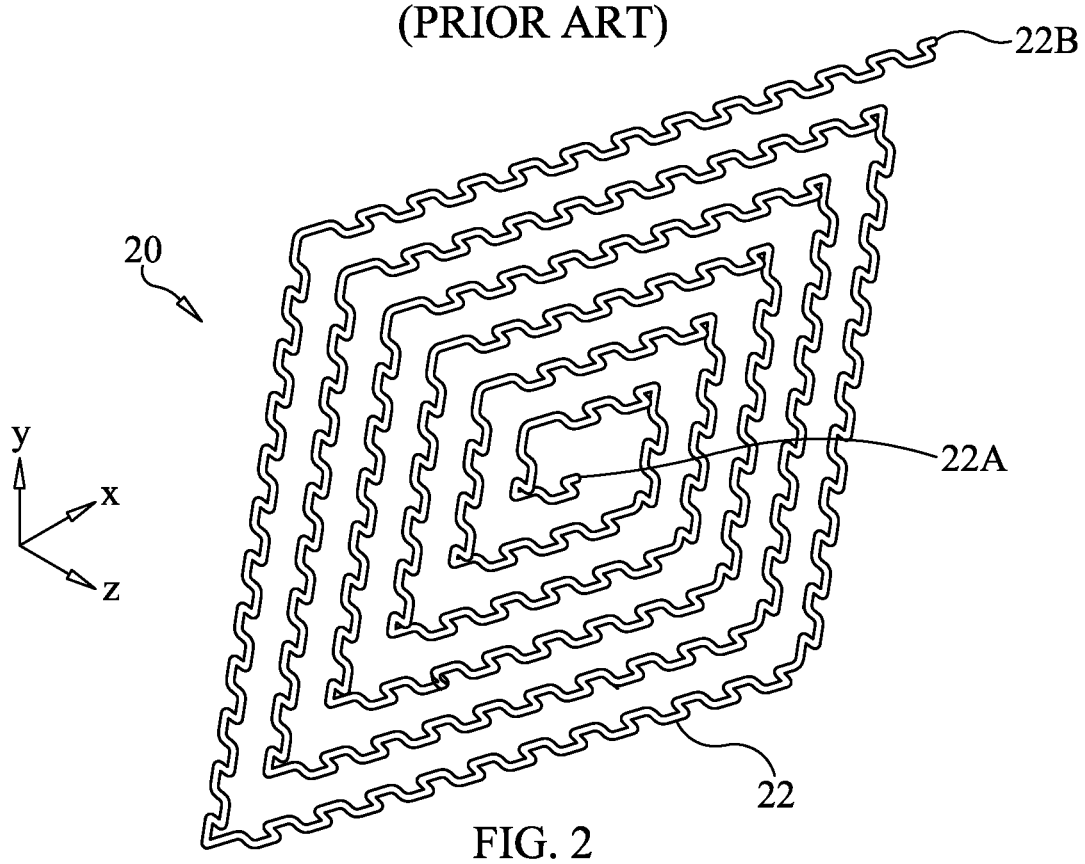
FIG. 2 is a perspective view of an undulating-conductor wireless sensor in accordance with an embodiment of the present invention.

Referring now to FIG. 2, an undulating-conductor wireless sensor in accordance with an embodiment of the present invention is shown and is referenced generally by numeral 20. Similar to the above-described spiral trace sensor 10, sensor 20 is a spiral winding of an electrically-conductive trace, wire, thread, or filament 22 (referred to simply as "conductor" hereinafter) that is open or electrically unconnected at its ends 22A and 22B and is, therefore, an open-circuit device. However, conductor 22 in sensor 20 does not lie in a plane, but rather undulates along its spiraling length between ends 22A and 22B such that sensor 20 resides in three dimensions. More specifically, the spiral aspect of conductor 22 resides in the X-Y dimensions and the undulation aspect of conductor 22 resides in the Z-dimension. The shape of the spiral pattern can be square (as shown), but can also be patterned after other shapes (e.g., triangles, rectangles, or other polygonal shapes) without departing from the scope of the present invention.

The undulation of conductor 22 in the Z-dimension provides another degree of tuning variability when optimizing sensor 20 for a particular application. The frequency produced by the sensor is a function of the pattern of the undulation(s), material used for conductor 22, and the length of conductor 22 which determines the sensor's overall resistance. The undulating conductor defines a harmonic standing wave pattern with nodes and anti-nodes. Parametric studies can be performed to verify sensor resonance for a particular design configuration.

Figure 3:
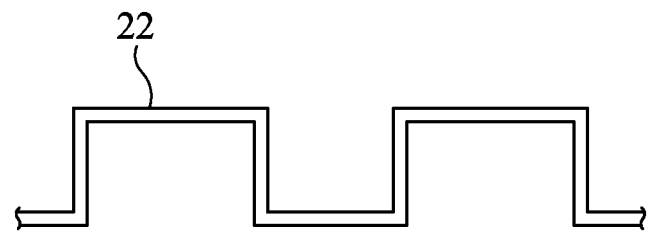
FIG. 3 is a side schematic view of a portion on undulating-conductor wireless sensor with the conductor defining a periodic and constant-amplitude square wave in accordance with an embodiment of the present invention.
Figure 4:
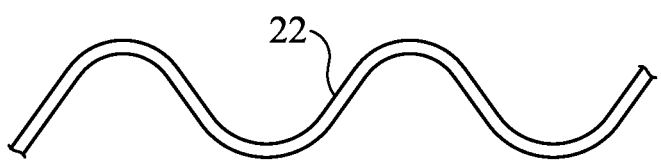
FIG. 4 is a side schematic view of a portion of an undulating-conductor wireless sensor with the conductor defining a periodic and constant-amplitude sine wave in accordance with another embodiment of the present invention.
Figure 5:
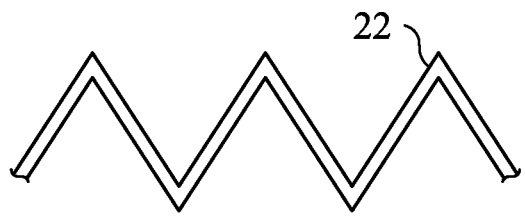
FIG. 5 is a side schematic view of a portion of an undulating-conductor wireless sensor with the conductor defining a periodic and constant-amplitude triangle wave in accordance with another embodiment of the present invention.

The undulation of the conductor in a spiral trace sensor of the present invention can be defined by a variety of periodic and constant-amplitude functions without departing from the scope of the present invention. Several non-limiting examples of such functions are shown in FIGS. 3-5 where a portion of conductor 22 is illustrated in a side view thereof. In FIG. 3, conductor 22 traverses a periodic and constant-amplitude square wave. FIG. 4 depicts conductor 22 traversing a sine wave, and FIG. 5 depicts conductor 22 traversing a triangle wave. Further, it is to be understood that the undulation of a conductor in a spiral trace sensor of the present invention could be defined by a plurality of different functions along its spiraling length without departing from the scope of the present invention.

Figure 6:
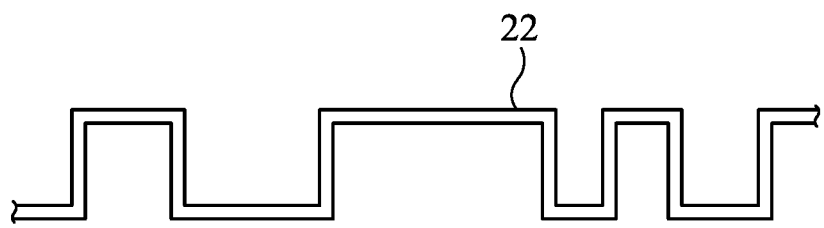
FIG. 6 is a side schematic view of a portion of an undulating-conductor wireless sensor with the conductor defining a non-periodic and constant-amplitude square wave in accordance with another embodiment of the present invention.

Undulation of the spiral trace sensor's conductor is not limited to a periodic undulation. By way of a non-limiting example, FIG. 6 illustrates conductor 22 traversing a non-periodic square wave. It is to be understood that other non-periodic functions (e.g., sine wave, triangle wave, etc.) or a plurality of such non-periodic functions could also be used to define the sensor's undulation without departing from the scope of the present invention.

Figure 7:
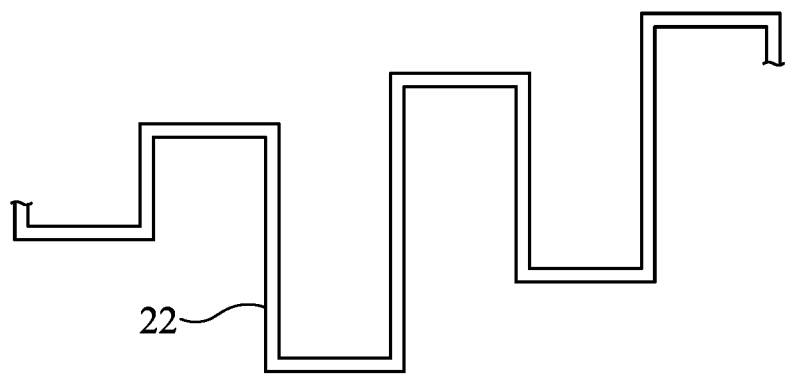
FIG. 7 is a side schematic view of a portion of an undulating-conductor wireless sensor with the conductor defining a varying-amplitude square wave in accordance with another embodiment of the present invention.

Undulation of the spiral trace sensor's conductor is also not limited to a constant-amplitude undulation. By way of a non-limiting example, FIG. 7 illustrates conductor 22 traversing a varying-amplitude square wave. It is further to be understood that other varying-amplitude functions or a plurality of varying-amplitude functions could be used to define the sensor's undulation without departing from the scope of the present invention. Still further, a conductor undulation scheme could be realized by a combination of non-periodic function(s) and varying-amplitude function(s) without departing from the scope of the present invention.

A specific undulation pattern of a sensor's conductor can be used to adjust or tune the sensor's response and its performance. For example, the undulation pattern can be used to provide multiple harmonic resonances (e.g., 2-node, 3-node, 4-node, 5-node, etc.). Response and performance predictability are made possible by the mathematical relationships between the wavelength of the undulation pattern to the length and width of the sensor. There is a direct relationship between the harmonics of the sensor and the pattern(s) of the undulation where such undulation patterns may be dictated by available manufacturing techniques. Accordingly, it is to be understood that manufacturing techniques will vary in accordance with available automation as well as the operational criteria required for a given application in order to produce sensors within acceptable spectral ranges.

Figure 8A:
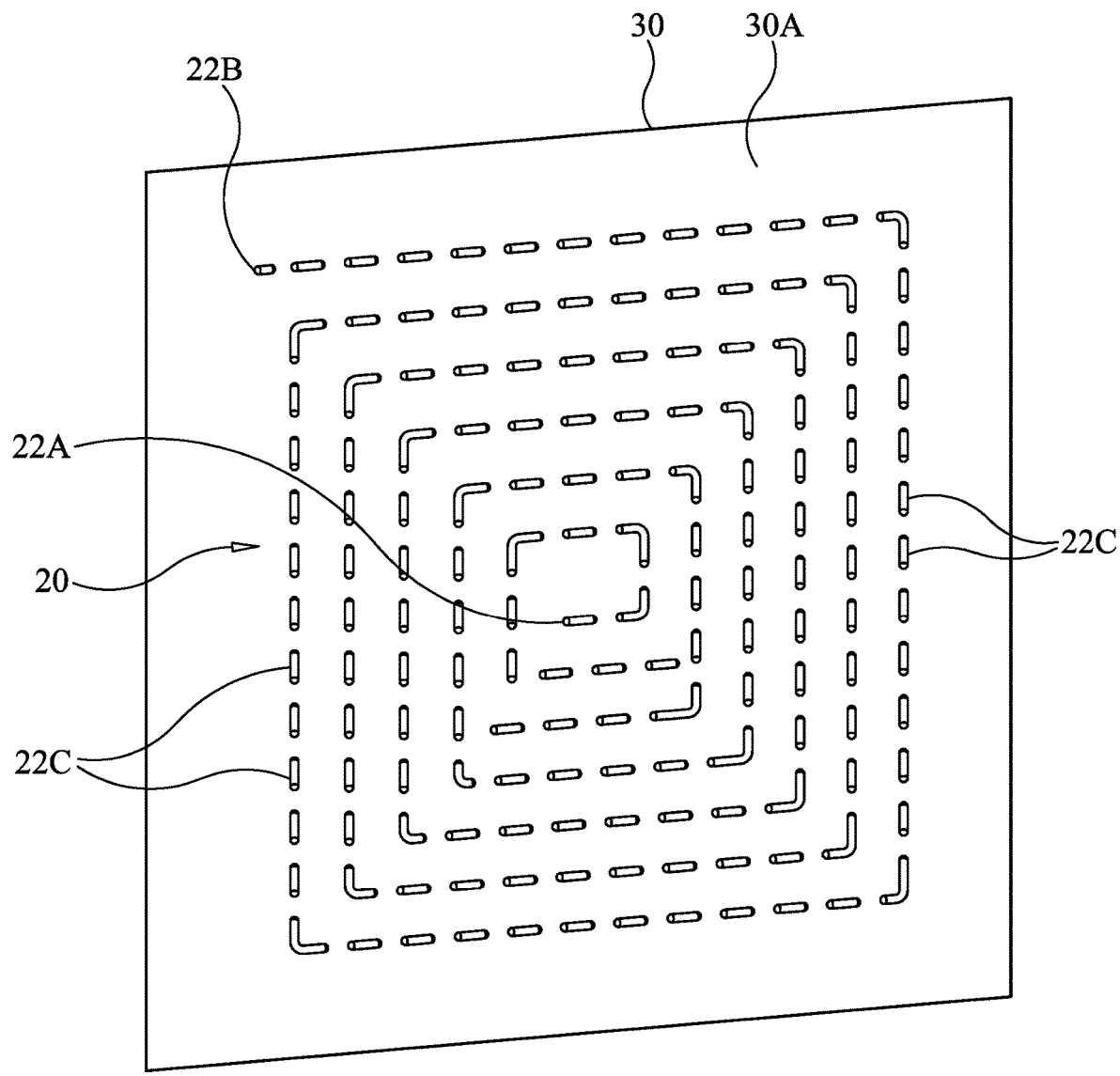
FIG. 8A is a perspective view of an undulating-conductor wireless sensor woven into a non-conducting material sheet as viewed from a first face of the sheet in accordance with an embodiment of the present invention.
Figure 8B:
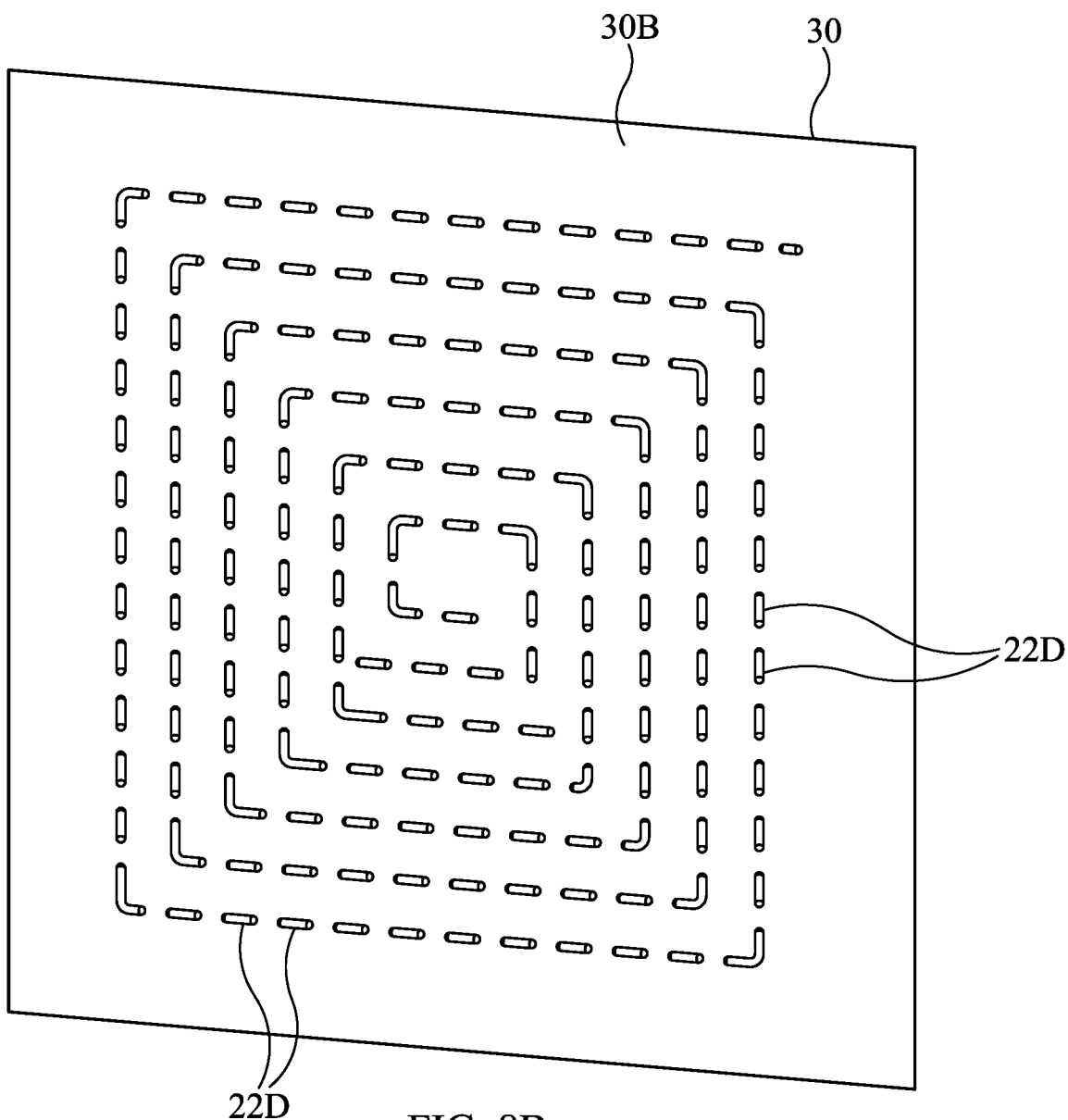
FIG. 8B is a perspective view of the undulating-conductor wireless sensor woven into the non-conducting material sheet as viewed from a second face of the sheet.
Figure 8C:
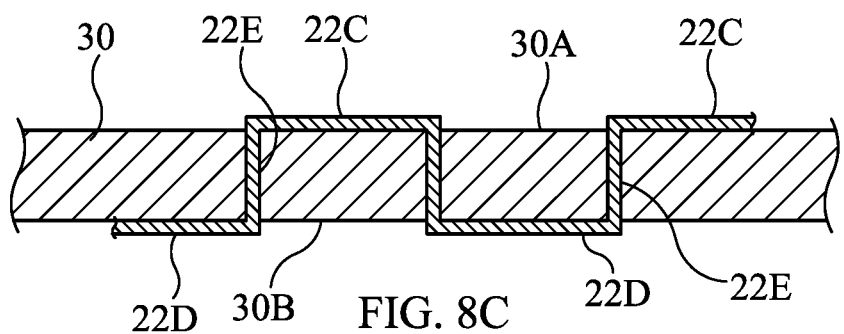
FIG. 8C is a cross-sectional view of a portion of the undulating-conductor wireless sensor and the non-conducting material sheet.

One or more spiral trace sensors of the present invention can be incorporated into or with a supporting substrate structure. For example, the undulating nature of the sensor's conductor 22 along its spiral pattern lends itself to be woven with or stitched into a non-conducting material sheet 30 as shown in FIGS. 8A-8C. More specifically, portions 22C of undulating conductor 22 forming sensor 20 are visible or exposed on a first face 30A of sheet 30 in FIG. 8A, and portions 22D of undulating conductor 22 forming sensor 20 are visible or exposed on a second face 30B of sheet 30 in FIG. 8B. The remaining portions 22E of undulating conductor 22 forming sensor 20 are contained within sheet 30 as illustrated in FIG. 8C. Suitable non-conducting material sheets include, but are not limited to, cotton or other natural-material fabrics, polyester or other man-made fabrics, fabrics made from a combination of natural and man-made materials, NOMEX, fiberglass, polyamide sheets, nylon fabrics, fabrics that include KEVLAR or other aramid fibers, neoprene rubber sheets, and paper-based sheets.

A variety of techniques can be used to create an undulating-conductor spiral trace sensor in accordance with the present invention. Techniques can include stitching such as hand sewing or basting as well as a variety of machine/automated stitching techniques. Stitch length (e.g., one-half period when the undulation scheme is defined by a periodic function) can be a variety of lengths without departing from the scope of the present invention. Examples of stitching types include, but are not limited to, running stitch and textured stitches such as the "wave B" stitch that facilitates creation of a spiral pattern. When an undulating-conductor spiral trace sensor of the present invention is to be fabricated via stitching, a variety of commercially-available threads or yarns can be used. For example, a variety of silver plated polyamide, monofilament, multifilament, and twisted yarns are commercially available. Other suitable conductor materials include graphene and nanocomposites. Still further, other suitable manufacturing techniques can include additive manufacturing.

Figure 9:
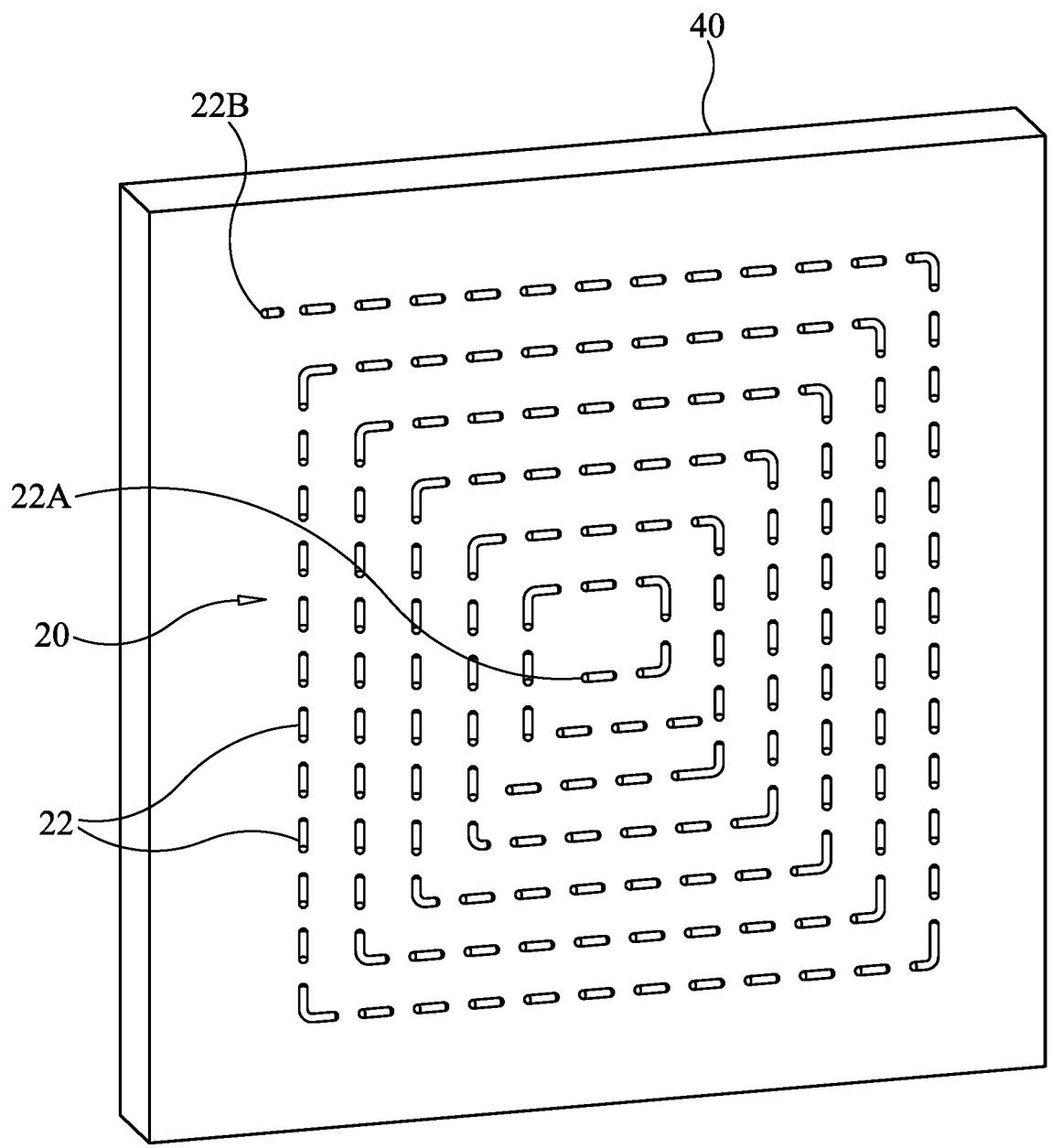
FIG. 9 is a perspective view of an undulating-conductor wireless sensor embedded in a non-conducting substrate in accordance with another embodiment of the present invention.

An undulating-conductor spiral trace sensor of the present invention could also be partially or fully embedded in a substrate structure 40 (e.g., during a molding process) as shown in FIG. 9 where only a portion of undulating conductor 22 forming sensor 20 is visible on the face of substrate structure 40 depicted in the figure. Undulating conductor 22 could also be completely embedded within structure 40 without departing from the scope of the present invention. Examples of substrate structure 40 could include, but are not limited to, single or multi-layer neoprene sheets or fabrics, composite laminate structures such as those that include neoprene, substrate structures created through additive manufacturing techniques, etc.

Figure 10:
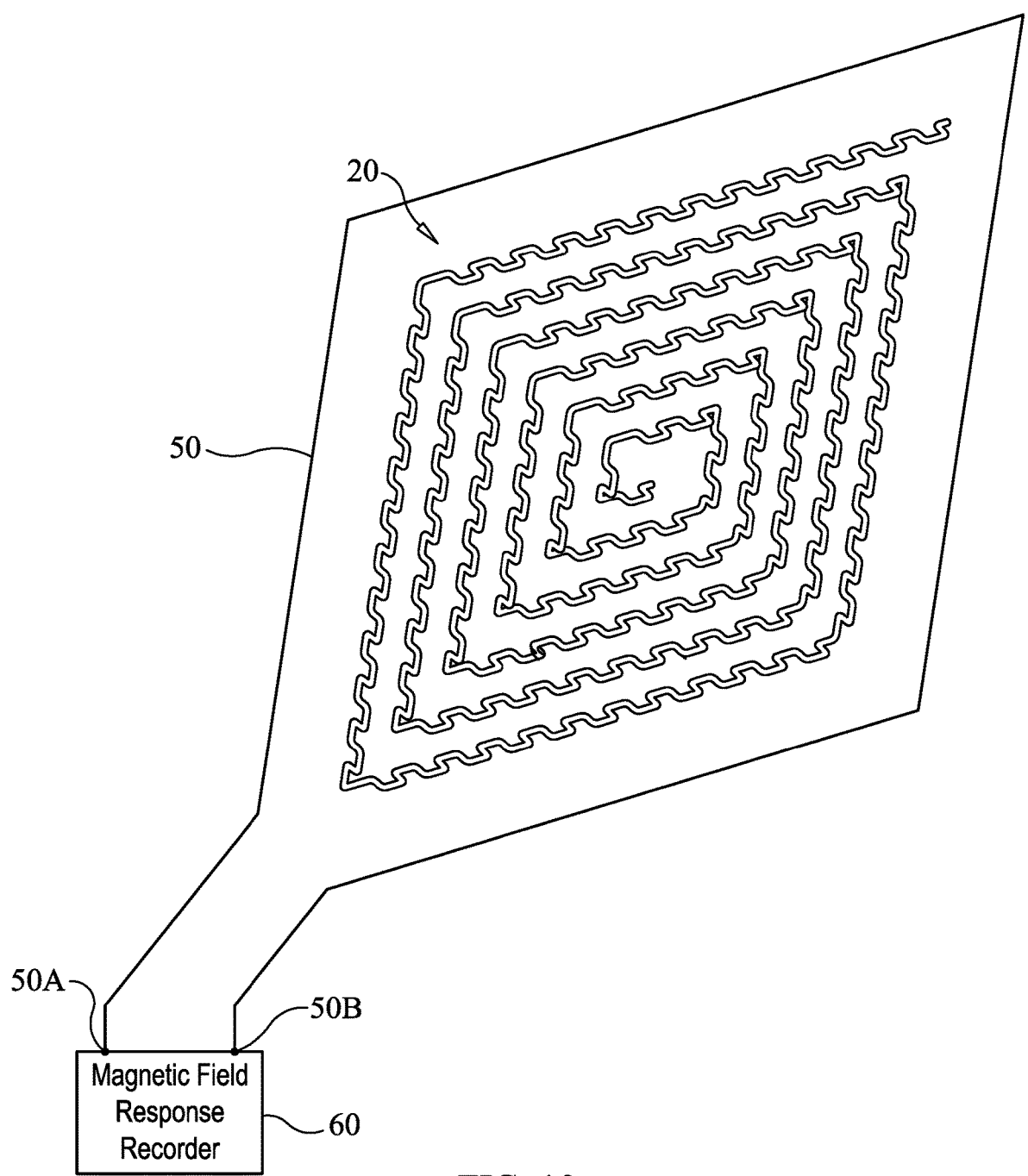
FIG. 10 is a perspective view of an undulating-conductor wireless sensor and a co-located interrogating antenna in accordance with an embodiment of the present invention.

As disclosed in previously-mentioned U.S. Pat. No. 8,430,327, a wireless spiral trace sensor of the present invention can be activated and interrogated by means of a time-varying magnetic field that is positioned such that the magnetic field interacts with the sensor. In accordance with an embodiment of the present invention, the interrogating antenna is a loop antenna that surrounds the undulating-conductor spiral trace sensor with the loop antenna residing within the amplitude range (i.e., in the Z-dimension) of the undulating conductor. The loop antenna can mimic the outer geometric shape of the spiral shape of the sensor as shown in FIG. 10 where a loop antenna 50 traverses a square around sensor 20. A magnetic field response recorder 60 would be coupled to ends 50A/50B of loop antenna 50. As is known in the art, recorder 60 generates the signal to excite loop antenna 50 for the generation of the time-varying magnetic field that will resonate sensor 20, and recorder 60 records the harmonic response changes of sensor 20.

Figure 11:
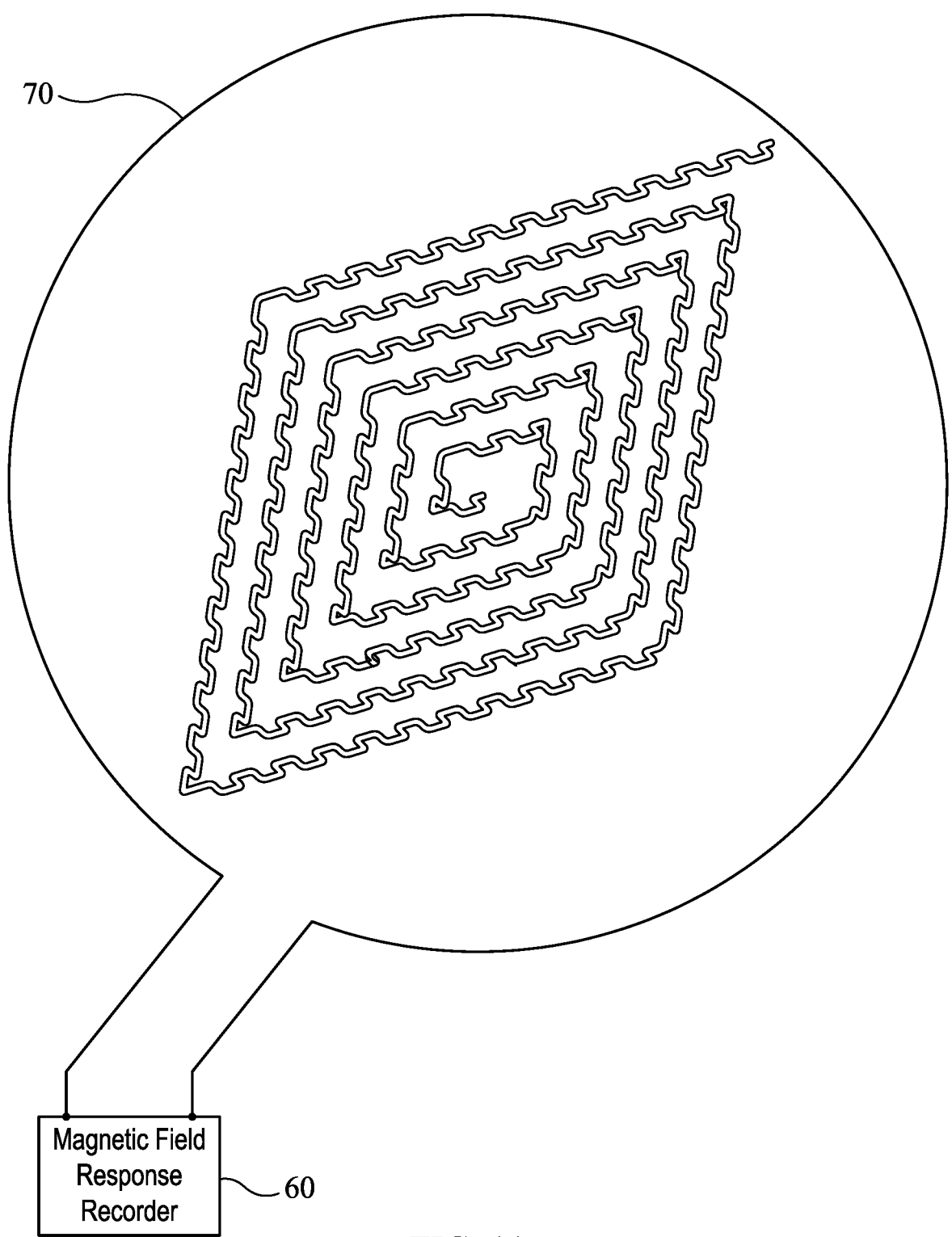
FIG. 11 is a perspective view of an undulating-conductor wireless sensor and a co-located interrogating antenna in accordance with another embodiment of the present invention.

It is to be understood that the loop antenna surrounding the undulating-conductor spiral trace sensor need not mimic the outer spiral shape of the sensor. Accordingly, FIG. 11 illustrates a circular loop antenna 70 around sensor 20. In either case, the loop antenna can be non-undulating along its radiating length (i.e., lie in a plane) or undulating along its radiating length without departing from the scope of the present invention. The undulating pattern of the antenna can be the same or different from that of the sensor without departing from the scope of the present invention.

Figure 12:
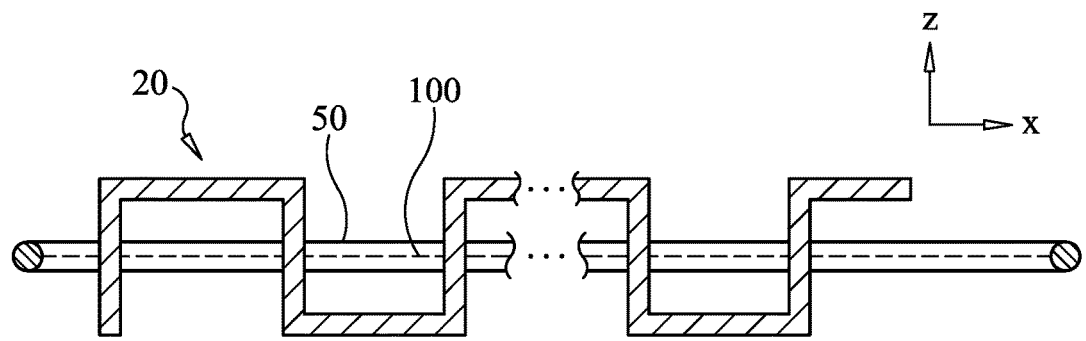
FIG. 12 is a cross-sectional view of an undulating-conductor wireless sensor and an interrogating antenna aligned with the zero X-Y dimension of the sensor in accordance with an embodiment of the present invention.
Figure 13:
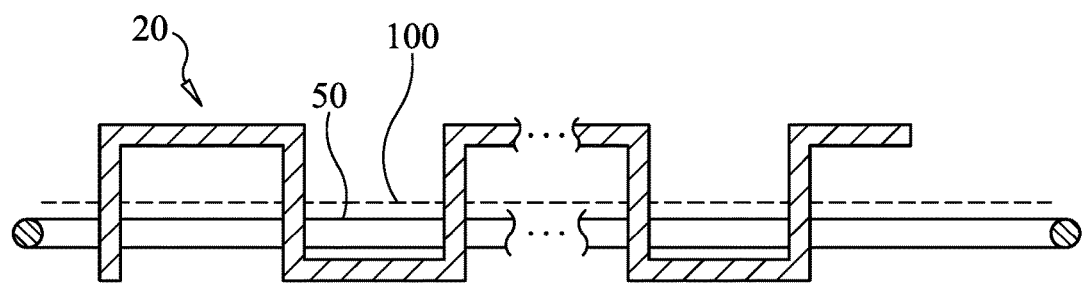
FIG. 13 is a cross-sectional view of an undulating-conductor wireless sensor and an interrogating antenna offset from and parallel to the zero X-Y dimension of the sensor in accordance with another embodiment of the present invention.
Figure 14:
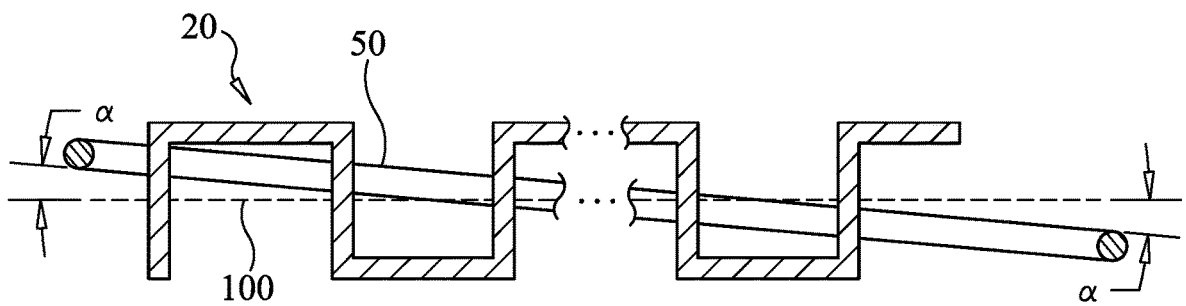
FIG. 14 is a cross-sectional of an undulating-conductor wireless sensor and an interrogating antenna at an acute angle to the zero X-Y dimension of the sensor in accordance with another embodiment of the present invention.

As mentioned above, a co-located and surrounding loop antenna must reside within the amplitude range of the sensor's undulating conductor. Several non-limiting examples of Z-dimension locations of a surrounding loop antenna are illustrated in FIGS. 12-14. In each of FIGS. 12-14, the plane of the paper represents the X-Z dimension and the Y-dimension extends into and out of the plane of the paper. The zero X-Y dimension or plane is referenced by dashed line 100. Referring first to FIG. 12, a loop antenna 50 is shown in a plane that is aligned with the zero X-Y dimension/plane 100 of sensor 20. In FIG. 13, loop antenna 50 is offset from and parallel to zero X-Y dimension/plane 100 of sensor 20. For example, loop antenna 50 could be located at a face of a supporting material sheet (not shown) adjacent to exposed portions of an undulating conductor as described previously herein. FIG. 14 illustrates loop antenna 50 disposed at an acute angle α with respect to zero X-Y dimension/plane 100 of sensor 20.

Figure 15:
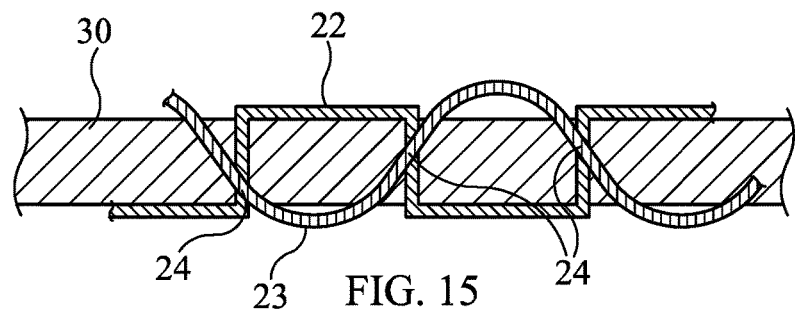
FIG. 15 is a cross-sectional of a portion of an undulating-conductor wireless sensor using two undulating conductors woven into a non-conducting material sheet along the sensor's spiral pattern in accordance with another embodiment of the present invention.

The present invention is not limited to a single undulating electrical conductor tracing a spiral pattern as described above. For example and as illustrated in FIG. 15, a wireless sensor's spiral pattern can be traced by two undulating conductors 22 and 23 woven into a non-conducting material sheet 30. In the illustrated example, the undulation pattern of conductor 22 resembles a square wave and the undulation pattern of conductor 23 resembles a sine wave. Conductors 22 and 23 contact one another periodically along their respective paths as indicated by contact points 24. The formation of undulating conductors 22 and 23 to define contact points 24 while being incorporated into sheet 30 can be accomplished using commercially-available sewing and/or embroidery machines (not shown). For example, undulating conductor 22 could be formed by the top needle of a sewing machine while undulating conductor 23 was simultaneously formed from the sewing machine's bottom or bobbin sewing action. It is to be understood that other stitch patterns could be used to create multiple undulating-electrical-conductors traversing a spiral pattern to define a wireless sensor in accordance with the teachings of the present invention.

Sensing systems constructed in accordance with the present invention can be based on a single spiral sensor as described above. However, multiple and separate wireless spiral sensors, each of which has undulating conductor(s), could be used in the design of a sensing system. For example, s sensing system using the teachings of the present invention could be formed using a plurality of separate spiral trace sensors, each of which is designed to have a unique resonant frequency indicative of a particular condition or state. In this way, a sensing system can be designed to track changes over a range of sensed conditions. Such sensing systems could also utilize combinations of spiral patterns (e.g., square patterns, triangular patterns, other polygonal patterns, etc.).

The advantages of the present invention are numerous. The undulating-conductor spiral trace sensor enhances the benefits of the wireless sensor art by adding a third dimension to improve sensor tuning and sensor response. The undulating feature lends itself to well-understood stitch-based manufacturing techniques thereby allowing sensors of the present invention to be incorporated into fabrics or other materials that are worn by humans or animals, or that are placed on structures to be monitored. The ready inclusion of the undulating-conductor sensor into fabrics, clothing, containers, etc., provides a new paradigm in the non-invasive sensing of vital signs, moisture, etc.

Although the invention has been described relative to a specific embodiment thereof, there are numerous variations and modifications that will be readily apparent to those skilled in the art in light of the above teachings. It is therefore to be understood that, within the scope of the appended claims, the invention may be practiced other than as specifically described.

What is claimed as new and desired to be secured by Letters Patent of the United States is:

1. A wireless sensor, comprising:
    a non-conductive material sheet having opposing faces; and
    an undulating electrical conductor having a first end and a second end, said undulating electrical conductor woven in an undulating fashion through said non-conductive material sheet along a spiral path between said first end and said second end wherein, along said spiral path, said undulating electrical conductor is partially exposed on a first of said opposing faces, partially exposed on a second of said opposing faces, and partially contained within said non-conductive material sheet, said first end and said second end remaining electrically unconnected, said undulating electrical conductor having inductance and capacitance wherein, in the presence of a time-varying magnetic field, said undulating electrical conductor resonates to generate a harmonic response.

2. A wireless sensor as in claim 1, wherein said undulating electrical conductor traces a periodic wave along said spiral path.

3. A wireless sensor as in claim 1, wherein said undulating electrical conductor traces a non-periodic wave along said spiral path.

4. A wireless sensor as in claim 1, wherein said undulating electrical conductor traces a constant-amplitude wave along said spiral path.

5. A wireless sensor as in claim 1, further comprising a loop antenna disposed about said undulating electrical conductor for introducing said time-varying magnetic field and for sensing said harmonic response.

6. A wireless sensor as in claim 1, further comprising a second undulating electrical conductor traversing said spiral path and in periodic electrical contact with said undulating electrical conductor along said spiral path.

7. A wireless sensor, comprising:
a non-conductive material sheet having opposing faces; and
an undulating electrical conductor having a first end and a second end, said undulating electrical conductor woven in an undulating fashion through said non-conductive material sheet along a spiral path between said first end and said second end, said undulating electrical conductor tracing a constant amplitude periodic wave along said spiral path wherein, along said spiral path, said undulating electrical conductor is partially exposed on a first of said opposing faces, partially exposed on a second of said opposing faces, and partially contained within said non-conductive material sheet, said first end and said second end remaining electrically unconnected, said undulating electrical conductor having inductance and capacitance wherein, in the presence of a time-varying magnetic field, said undulating electrical conductor resonates to generate a harmonic response.

8. A wireless sensor as in claim 7, further comprising a loop antenna disposed about said undulating electrical conductor for introducing said time-varying magnetic field and for sensing said harmonic response.

9. A wireless sensor as in claim 7, further comprising a second undulating electrical conductor traversing said spiral path and in periodic electrical contact with said undulating electrical conductor along said spiral path.

* * * * *